United States Patent [19]
Livingston

[11] 3,972,746
[45] Aug. 3, 1976

[54] CO-SI-X ALIGNED EUTECTICS
[75] Inventor: James D. Livingston, Schenectady, N.Y.
[73] Assignee: General Electric Company, Schenectady, N.Y.
[22] Filed: Sept. 2, 1975
[21] Appl. No.: 609,593

[52] U.S. Cl. .................................. 148/32; 75/170; 75/171
[51] Int. Cl.² ........................................ C22C 19/07
[58] Field of Search ............... 75/170, 171; 148/32, 148/32.5

[56] References Cited
UNITED STATES PATENTS
3,694,193   9/1972   Carpay et al. .................... 75/170

Primary Examiner—R. Dean
Attorney, Agent, or Firm—Jane M. Binkowski; Joseph T. Cohen; Jerome C. Squillaro

[57] ABSTRACT

Alloys of Co-Si-X, where X is selected from the group consisting of Ta, Nb, V or alloys thereof, are directionally solidified to produce aligned eutectics.

6 Claims, 1 Drawing Figure

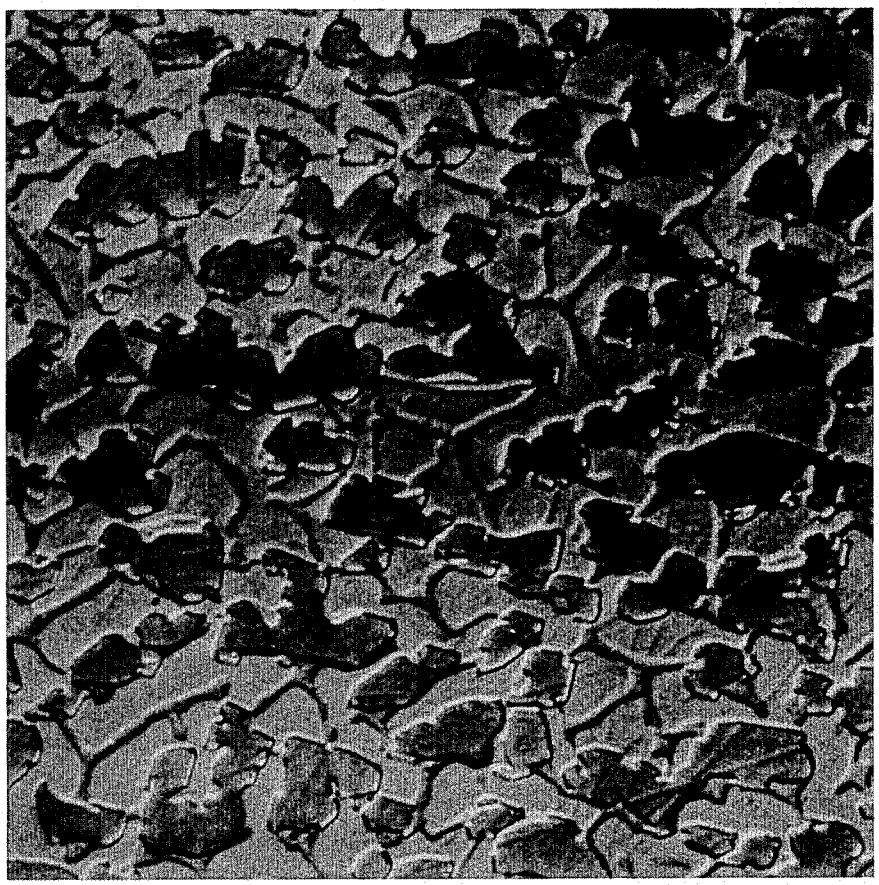

CO-SI-X ALIGNED EUTECTICS

The invention described herein was made in the course of, or under, a contract with the Naval Air Development Center, Warminster, Pa.

The art has disclosed the unidirectional solidification of certain metal alloy systems to produce aligned eutectic structures. A eutectic alloy or composition is defined as one which upon being cooled from the liquid state freezes or solidifies at a fixed temperature called the eutectic temperature to produce simultaneously a mixture of two or more types of metallurgical phases.

The present invention relates to the unidirectional solidification of a cobalt-silicon-X alloy, where X is selected from the group consisting of tantalum, niobium, vanadium or alloys thereof, to produce novel aligned eutectics consisting essentially of at least two phases. The present aligned eutectics are substantially or completely free of dendrites and have substantial tensile strength at elevated temperatures of the order of 900°C making them useful for a wide range of applications.

The invention will be better understood from the following description taken in conjunction with the accompanying FIGURE which is a photomicrograph (1500 X) of a transverse section of directionally solidified Co-Si-Ta aligned eutectic showing three phases. Irregular gray rods are $Co_2Si$, light matrix is Co-rich solid solution, ribbon-like phase is $Co_{16}Si_7Ta_6$.

Briefly stated, the present process comprises forming a Co-Si-X alloy body where X is selected from the group consisting of Ta, Nb, V or alloys thereof and where the amount of Si ranges from 21 atomic % to 27 atomic % and X ranges from 1 atomic % to 8 atomic %, said alloy having a eutectic temperature at which it solidifies to form a solid alloy having at least two phases, establishing a liquid-solid interface in said alloy body, establishing a thermal gradient ranging from 100°C/cm to 500°C/cm in the liquid at said liquid-solid interface, and unidirectionally solodifying said liquid at said liquid-solid interface at a rate ranging from 0.5 cm per hr to 12 cm per hr.

The aligned eutectic of the present invention is substantially or completely free of dendrites and consists essentially of at least two phases with one phase being in the form of rods of irregular circumference or lamellae passing through a matrix of the second phase. The rods and/or lamellae are significantly parallel to each other and to the thermal gradient. Also, they are significantly uniformly distributed throughout the aligned eutectic.

In the Co-Si-X alloy of the present invention, X is selected from the group consisting of Ta, Nb, V or alloys thereof. Specifically, the present Co-Si-X alloy contains Si in an amount ranging from 21 atomic % to 27 atomic % and X in an amount ranging from 1 atomic % to 8 atomic %. Alloy compositions outside these ranges do not produce the present aligned eutectics. When X is Ta, the preferred alloy contains 22 atomic % Si and 4 atomic % Ta because it produces microstructures free or most free of dendrites.

Generally, in carrying out the instant process, the alloy components are melted together to obtain as uniform a molten mass as possible. The molten mass is then cast by a conventional method to produce an alloy body of the desired size.

The alloy body can be directionally solidified by a number of conventional methods. Generally, the apparatus is comprised of a heated vertical mold provided with a cooling system at its lower end, usually water, and means for controlling the rate of solidification, usually by pulling the ingot-containing mold at a constant rate away from the heat source used to melt the ingot.

Directional solidification is carried out under an inert atmosphere such as argon. Specifically, in carrying out the directional solidification, the alloy body is heated above its eutectic temperature, which generally is about 1200°C, to liquify at least a portion thereof throughout its entire cross-sectional area to establish a liquid-solid interface.

In preparing the aligned eutectic alloy of the present invention, the thermal gradient in the liquid at the liquid-solid interface and the rate of solidification are controlled during unidirectional solidification. Specifically, this thermal gradient is the change in temperature in the liquid per centimeter of length in the liquid phase immediately in front of the liquid-solid interface and ranges from 100°C per cm to about 500°C per cm. The specific thermal gradient used depends largely on the specific rate of unidirectional solidification and to some extent on alloy composition.

The unidirectional rate of solidification, i.e. the number of centimeters of aligned eutectic formed in one hour, ranges from 0.5 cm per hr to 12 cm per hr. Faster rates of solidification require correspondingly higher thermal gradients to maintain significant alignment of the phases of the present aligned eutectic. Also, the faster the rate of solidification, the finer are the resulting phases.

The aligned Co-Si-X eutectic alloy of the present invention is substantially or completely free of dendrites and consists essentially of at least two phases with one phase being in the form of rods of irregular circumference and/or lamellae passing through a matrix of the second phase. The rods and/or lamellae consist essentially of a $Co_2Si$ phase or a $Co_2Si$ phase containing a minor amount of X. The rods and/or lamellae are significantly parallel to each other and are distributed significantly uniformly throughout the aligned eutectic. The rods have a density ranging from about $10^8$ per square centimeter to about $10^5$ per square centimeter. The thickness of the lamellae ranges from about 2 microns to 20 microns. Optimum rod sizes and density or optimum lamellae size are determined by the particular application and may vary from one application to another. Finer-sized rods and/or lamellae lead to higher tensile strength but decreased thermal stability. The matrix is a Co-rich solid solution phase containing Si in solution, generally in an amount ranging from 8 atomic % to 15 atomic %, and contains X in solution ranging up to the amount present. Also, the present aligned eutectic has a minimum tensile strength at 900°C of at least 30,000 psi measured in an inert atmosphere such as argon or a substantial vacuum.

In the Co-Si-X alloy, when X is Ta, the resulting aligned eutectic of the present invention also contains a third phase which is ribbon-like in form and which is composed of $Co_{16}Si_7Ta_6$. This third phase is distributed significantly uniformly throughout the matrix of the aligned eutectic.

In one embodiment of the present invention, chromium is substituted in an amount ranging up to 18 atomic % for a portion of the Co in the Co-Si-X alloy to produce an aligned eutectic with improved oxidation and corrosion resistance. The chromium has no significant deleterious effect on the microstructure of the resulting aligned eutectic and generally substantially all of it is present in solid solution in the Co-rich matrix. The resulting chromium-containing aligned eutectic also has a minimum tensile strength at 900°C of at least 30,000 psi measured in an inert atmosphere such as argon or a substantial vacuum. Amounts of chromium in excess of 18 atomic % tend to have a deleterious effect on the tensile properties of the aligned eutectic.

The present aligned eutectics are particularly useful as high temperature structural alloys such as blades or vanes for high temperature turbines. Specifically, in addition to their substantial tensile strength, the aligned eutectics have a microstructure which is thermally stable, i.e., the microstructure undergoes no significant change in an inert atmosphere such as argon or a substantial vacuum at a temperature up to and including 1100°C. Also, the present aligned eutectics have a surface which is significantly stable, i.e., significantly resistant to oxidation, because of the protective nature of the silicon.

The invention is further illustrated by the following examples:

EXAMPLE 1

A 74 atomic % Co, 22 atomic % Si, 4 atomic % Ta alloy as formed under argon and cast into a rod ⅜ inch in diameter and 5 inches long.

Conventional apparatus was used to directionally solidify the rod. It included a high frequency induction vertical furnace, a water-cooled copper chill plate and a lowering device. Specifically, the rod was placed in a close-fitting alumina crucible and the resulting assembly placed in the vertical furnace. Directional solidification was carried out under an argon atmosphere. A portion of the rod was melted throughout an entire cross-sectional area and a liquid-solid interface was established at the bottom portion of the rod. A thermal gradient of 750°C/in or 300°C/cm was established in the liquid at the liquid-solid interface. The liquid at the liquid-solid interface was then directionally solidified at a rate of ¼ inch per hr or 0.625 cm per hr.

The resulting aligned rod was sectioned longitudinally and traversely and examined using standard metallographic procedure. It appeared to be free of dendrites. It had a significantly uniform aligned eutectic microstructure as illustrated in the accompanying FIGURE which shows the transverse section. Specifically, it had three phases, one of which was a plurality of rods having an irregular circumference extending through a matrix of the second phase. The irregular rods were significantly parallel to each other and to the thermal gradient. The third phase was ribbon-like in form and ran between neighboring rods as illustrated in the FIGURE. The phases were distributed significantly uniformly in the aligned eutectic.

Microprobe analysis of the separate phases indicated that the gray rods or irregular circumference were $Co_2Si$, that the light matrix was Co with 12 atomic % Si and that neither phase contained detectable Ta. All the Ta appeared to be in the third, ribbon-like phase in the matrix which ran between neighboring $Co_2Si$ rods. The approximate composition of this third phase was 58 atomic % Co, 26 atomic % Si, and 16 atomic % Ta. This phase is identified with the ternary compound $Co_{16}Si_7Ta_6$ or G-phase.

EXAMPLE 2

An aligned eutectic rod was prepared as set forth in Example 1 except that the alloy composition in atomic % was 67 Co, 22 Si, 7.3 Cr, 3.7 Ta.

A portion of the aligned rod was sectioned longitudinally and transversely and examined using standard metallographic procedure. It had a significantly uniform aligned eutectic microstructure and appeared to be free of dendrites.

The tensile properties of the remaining portion of the aligned rod were determined by a standard technique at a temperature of 900°C in vacuum. It had a 0.1 percent yield stress of 54,800 psi, an ultimate tensile strength of 57,400 psi and an elongation of 27 percent.

The following cited copending patent applications are, by reference, made part of the disclosure of the present application.

In copending U.S. Pat. application, Ser. No. 609,592 entitled "Co-Si-X Aligned Eutectics" filed of even date herewith in the name of James D. Livingston and assigned to the assignee hereof, there is disclosed alloys of Co-Si-X, where X is selected from the group consisting of W, Mo or alloys thereof, which are directionally solidified to produce aligned eutectics.

In copending U.S. Pat. application Ser. No. 609,591 entitled "Co-Si-X Aligned Eutectics" filed of even date herewith in the name of James D. Livingston and assigned to the assignee hereof, there is disclosed alloys of Co-Si-X, where X is selected from the group consisting of Al, Ga or alloys thereof, which are directionally solidified to produce aligned eutectics.

What is claimed is:

1. A process for producing an aligned solid eutectic having significant tensile strength which comprises forming a Co-Si-X alloy body where X is selected from the group consisting of Ta, Nb, V or alloys thereof and where the amount of Si ranges from 21 atomic % to 27 atomic % and X ranges from 1 atomic % to 8 atomic %, said alloy having a eutectic temperature at which it solidifies to form a solid alloy having at least two phases, establishing a liquid-solid interface in said alloy body, establishing a thermal gradient ranging from 100°C/cm to 500°C/cm in the liquid at said liquid-solid interface, and unidirectionally solidifying said liquid at said liquid-solid interface at a rate ranging from 0.5 cm per hr to 12 cm per hr, said aligned eutectic being substantially or completely free of dendrites and consisting essentially of at least two phases with one phase being in the form of a plurality of rods of irregular circumference and/or lamellae passing through a matrix of the second phase, said rods and/or lamellae being significantly parallel to each other and to the thermal gradient.

2. A process for producing an aligned solid eutectic having significant tensile strength according to claim 1 where X is Ta and wherein said one phase is in the form of a plurality of rods of irregular circumference and where there is also a third ribbon-like phase running between neighboring rods.

3. A process for producing an aligned solid eutectic according to claim 1 where chromium is substituted in an amount ranging up to 18 atomic % for a portion of the cobalt in said Co-Si-X alloy.

4. A unidirectionally solidified aligned eutectic of a Co-Si-X alloy having significant tensile strength where Si ranges from 21 atomic % to 27 atomic % and where X ranges from 1 atomic % to 8 atomic %, said X being selected from the group consisting of Ta, Nb, V or alloys thereof, said aligned solid eutectic consisting essentially of at least two phases with one phase being in the form of a plurality of rods of irregular circumference and/or lamellae passing through a matrix of the second phase, said rods and/or lamellae being significantly parallel to each other, said aligned eutectic being substantially or completely free of dendrites.

5. A unidirectionally solidified aligned eutectic of a Co-Si-X alloy according to claim 4 where X is Ta and wherein said one phase is in the form of a plurality of rods of irregular circumference and where there is also a third ribbon-like phase running between neighboring rods.

6. A unidirectionally solidified aligned eutectic according to claim 4 wherein chromium is substituted in an amount ranging up to 18 atomic % for a portion of the cobalt in said Co-Si-X alloy.

* * * * *